United States Patent
Beam et al.

[11] Patent Number: 4,890,198
[45] Date of Patent: Dec. 26, 1989

[54] PROCESS AND APPARATUS FOR RETAINING A CIRCUIT BOARD IN A MOUNTED POSITION IN A COMPUTER HOUSING

[75] Inventors: Don E. Beam; Harold J. Sampson, both of Cambridge, Ohio

[73] Assignee: NCR Corporation, Dayton, Ohio

[21] Appl. No.: 347,115

[22] Filed: May 1, 1989

[51] Int. Cl.⁴ ............................................. H05K 7/14
[52] U.S. Cl. ..................... 361/399; 53/147; 206/334; 206/592; 361/415; 361/417; 361/419; 361/420
[58] Field of Search ............................ 29/819; 211/41; 206/328, 334, 560, 561, 591, 592; 361/331, 380, 394, 395, 399, 415, 417, 419, 420; 52/472

[56] References Cited

U.S. PATENT DOCUMENTS

| | | | |
|---|---|---|---|
| 4,198,024 | 4/1980 | Cavanna | 248/544 |
| 4,477,135 | 10/1984 | Pronto | 339/14 R |
| 4,607,751 | 8/1986 | Straccia, Sr. et al. | 211/41 |
| 4,745,524 | 5/1988 | Patton, III | 361/399 |
| 4,747,018 | 5/1988 | Munsey et al. | 361/415 |
| 4,748,539 | 5/1988 | Fukuyama | 361/417 |

*Primary Examiner*—Gregory D. Thompson
*Attorney, Agent, or Firm*—Wilbert Hawk, Jr.; Albert L. Sessler, Jr.; Elmer Wargo

[57] ABSTRACT

A method and retainer for retaining a circuit board in a mounted position within a housing of an electronic device. A working distance is determined, which is defined as the distance between the circuit board and the housing, and the length of the retainer is adjusted to such working distance, so that when a first end portion of the retainer is secured to a circuit board and the circuit board is mounted in the housing, the second end portion of the retainer is positioned to engage the housing and thereby retain the circuit board in a mounted position during shipment of the electronic device.

11 Claims, 2 Drawing Sheets

PROCESS AND APPARATUS FOR RETAINING A CIRCUIT BOARD IN A MOUNTED POSITION IN A COMPUTER HOUSING

BACKGROUND OF THE INVENTION

1. Field of the Invention.

This invention relates to a retainer, and more particularly, it relates to a retainer and a method for securing a circuit board in a mounted position in a housing of an electronic device during shipment of the electronic device.

2. Description of Related Art.

In recent years, the use of one or more circuit boards in a computer system has become widespread. Circuit boards provide a user great flexibility because, for example, the circuit boards can be manufactured to incorporate many different features and functions, and the circuit boards can be easily mounted in suitable connectors on a processing or mother board inside a housing of an electronic device.

A computer system, such as a Point of Sale terminal, Electronic Funds Transfer terminal, or Personal Computer, for example, (hereinafter "electronic device"), may incorporate one or more circuit boards which perform various functions. The circuit board may be mounted inside the housing of the electronic device before the device is transported from one location to another location. During the transportation, handling or installation of the device, the circuit board may become fully or partially dismounted. A fully or partially dismounted circuit board may cause the device to malfunction when a user attempts to use the device. This type of malfunction can be difficult to detect (particularly, if the circuit board is only partially dismounted) because the device may continue to operate properly in some respects. Accordingly, a user may spend a considerable amount of time and expense in identifying the partially or fully dismounted circuit board as the source of the malfunction.

SUMMARY OF THE INVENTION

There is, therefore, a present need to provide an apparatus for retaining a circuit board in a mounted position which is inexpensive to manufacture and which can be easily installed in a housing of an electronic device.

This invention overcomes the problems in the prior art by providing an apparatus and a method for retaining a circuit board in a mounted position inside the housing of an electronic device during shipment of the electronic device.

In one aspect of this invention, there is provided a retainer for retaining a circuit board in a mounted position in a housing of an electronic device, the retainer comprising: a body having a length and also having first and second end portions, a securing elements for securing the first end portion to the circuit board, and the second end portion including an adjusting elements for adjusting the length of the body to attain a working length so that when the first end portion is secured to the circuit board and the circuit board is mounted in he housing, the second end is positioned to engage the housing and retains the circuit board in the mounted position.

In another aspect of this invention, there is provided a retainer for retaining a circuit board in a mounted position in a housing of an electronic device during shipment of the electronic device, said circuit board and housing having a working length therebetween when the circuit board is in the mounted position in the electronic device, said retainer comprising: a body having a length and also having first and second end portions, at least two resilient fingers located on said first end portion, said two resilient fingers being generally biased towards each other and adaptable for accommodating circuit boards of varying thicknesses, and said second end portion having a plurality of frangible portions which can be removed, as necessary, in order to adjust said length of said body to attain the working length so that when said first end portion is secured to the circuit board and the circuit board is in said mounted position in the housing, said second end portion is positioned to engage the housing and retain the mounted circuit board in the mounted position.

In yet another aspect of this invention, there is provided a method for retaining a mounted circuit board in the housing of an electronic device during shipment of the electronic device. The electronic device has a circuit board mounted in a mounted position inside the housing with the distance between the mounted circuit board and the housing being defined as the working distance. The method comprises the steps of: (a) selecting a retainer including a body having a length and also having first and second end portions, said second end portion having at least one frangible portion, (b) securing said first end portion to the circuit board, (c) removing, as necessary, one or more frangible portions from said body to attain the working length, and (d) positioning said retainer between the circuit board in the mounted position and the housing to retain the circuit board in the mounted position in the housing.

This invention is relatively simple to implement, and it is low in cost to manufacture. These advantages and others will become more apparent in connection with the following description, claims and drawing.

DESCRIPTION OF THE PREFERRED EMBODIMENT

Figure 1:
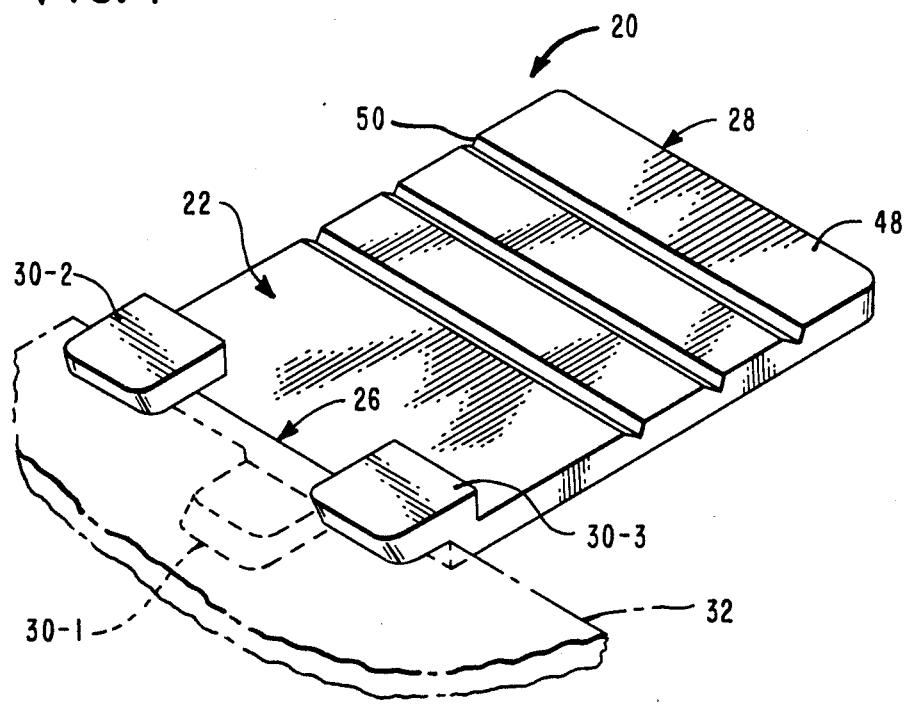
FIG. 1 is an isometric view showing a preferred the apparatus or retainer of this invention.
Figure 2:
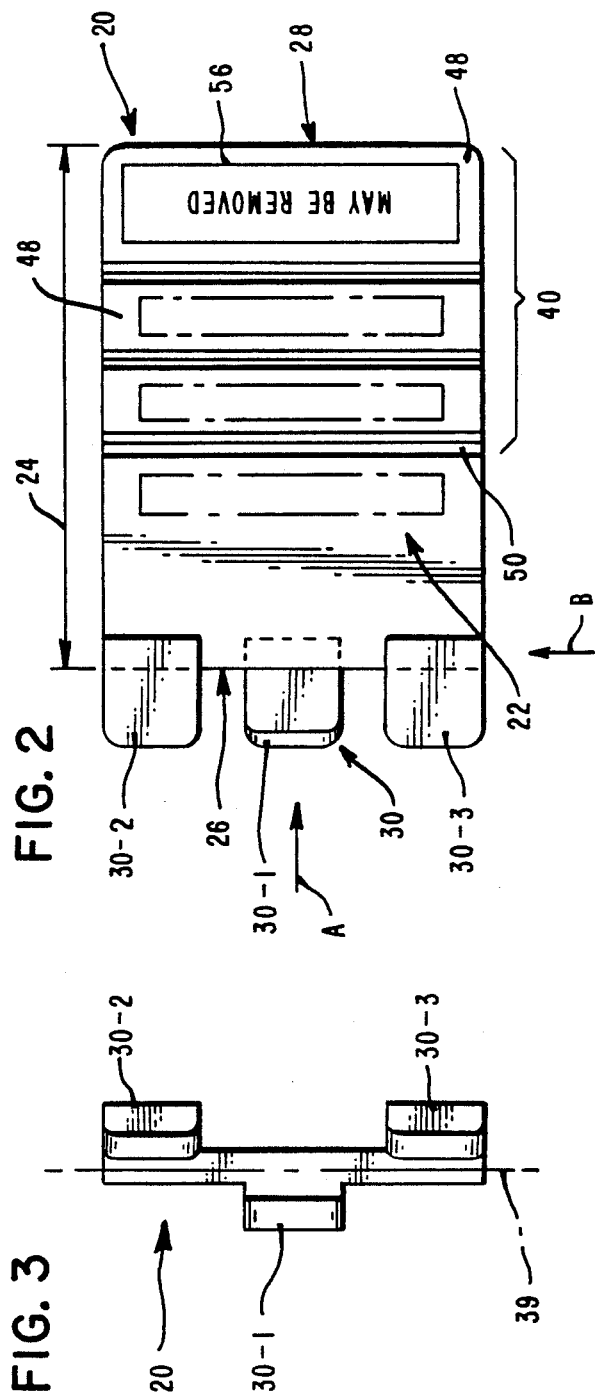
FIG. 2 is a front view of the retainer showing the body resilient fingers and frangible portions.

FIG. 1 shows a preferred embodiment of the apparatus or retainer of this invention, designated generally as retainer 20. The retainer 20 (FIGS. 1–4) is generally comprised of a body 22 having an overall body length 24, as shown in FIG. 2. The body 22 also includes first and second end portions, designated generally as 26 and 28 (FIG. 2), respectively.

Figure 5:
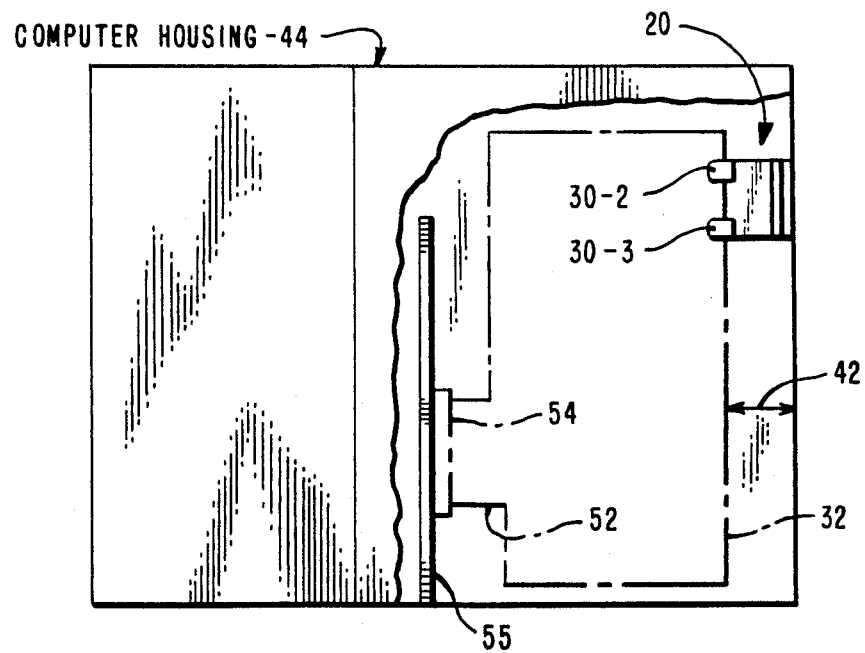
FIG. 5 is a side view of a housing of an electronic device, with the housing partially broken away to show a typical environment in which the retainer might be used.

The retainer 20 also includes a securing means 30 (FIG. 2) for securing the first end portion 26 to a circuit board 32 (shown in dashed outline in FIGS. 1 and 5).

Figure 3:
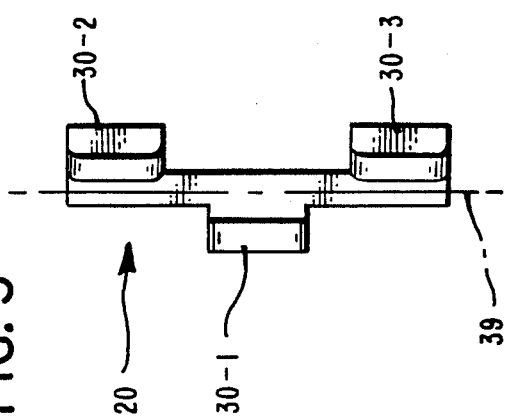
FIG. 3 is an end view of the retainer, taken in the direction of arrow A in FIG. 2, showing the resilient fingers biased towards an imaginary plane.
Figure 4:
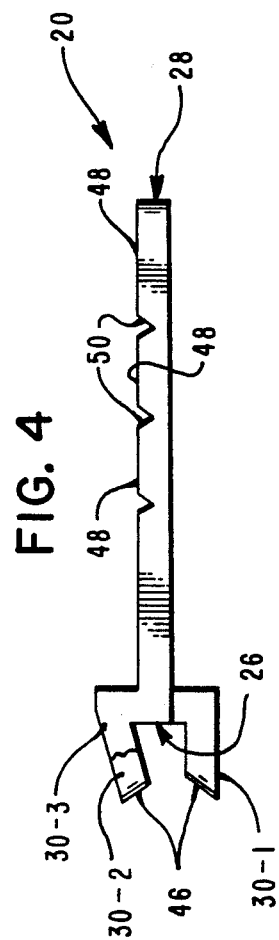
FIG. 4 is a bottom view of the retainer taken in the direction of arrow B in FIG. 2 to show lines of weakness in the body retainer and the bias of the resilient fingers.

One way to effect the securing means 30 is by use of, for example, resilient fingers 30-1, 30-2, and 30-3, shown in FIGS. 1–4. Such fingers are generally planar and extend away from the first end portion 26 of the body 22, as best shown in FIG. 1. Such fingers 30-1, 30-2, and 30-3 are also biased towards an imaginary plane, shown by dashed line 39 in FIG. 3, and they are capable of accommodating and gripping circuit boards of varying thicknesses. FIG. 3 shows how the resilient fingers 30-2 and 30-3 are in general opposed operative relationship to the resilient finger 30-1. Notice that the finger ends 46 of the resilient fingers 30-1, 30-2 and 30-3 are angled or beveled inwardly, as shown in FIG. 4 and as further described below, to facilitate sliding the retainer 20 onto the circuit board 32. The use and operation of the securing means 30 will be described later herein.

As mentioned previously, the purpose of retainer 20 is to retain the circuit board 32 in a mounted position. In order to effect this purpose, the second end portion 28 (FIG. 2) of the body 22 includes an adjusting means 40 for adjusting the length 24 of the body 22 to attain a working length, indicated as 42 in FIG. 5, prior to the retainer 20 being installed in a housing 44 (FIG. 5). The working length 42 is defined generally as the distance between the housing 44 and the circuit board 32 after the circuit board 32 is mounted in the housing 44. In the preferred embodiment of the invention, the adjusting means 40 is generally planar and is comprised of frangible portions 48, as shown in FIG. 4. Notice that a line of weakness 50 (FIG. 4) separates adjacent frangible portions 48. The line of weakness 50 can be, for example, a score line or a perforated line. The line of weakness 50 enables a user to change the length 24 of the body 22 by removing, as necessary, one or more of the frangible portions 48 at the associated line or lines of weakness 50. The operation and use of the adjusting means 40 is described in detail below.

The method for using the retainer 20 is as follows. In a computer system, the circuit board 32 having a typical male connector or terminal 52 (FIG. 5) is mounted into a complementary female connector or terminal 54 of a mother board 55 within the housing 44 of the electronic device. The working length 42 is first determined by examining the distance between the circuit board 32 and the housing 44 after the circuit board 32 is mounted in the housing 44. The length 24 of the body 22 is thereafter adjusted to attain a length equal to or slightly less than the working length 42 by removing, as necessary, one or more frangible portions 48 at the associated line of weakness 50. The retainer 20 is then positioned between the circuit board 32 and the housing 44 when the circuit board 32 is in the mounted position on the mother board 55. In this regard, the resilient fingers 30-1, 30-2, and 30-3 are "pushed" or "slid" onto the circuit board 32, thereby enabling the resilient fingers 30-1, 30-2, and 30-3 to grip the circuit board 32. As indicated previously, the finger ends 46 of the resilient fingers 30-1, 30-2, and 30-3 can be angled or beveled inwardly, as shown in FIG. 4, to facilitate sliding the retainer 20 onto the circuit board 32. When the first end portion 26 is secured to the circuit board 32 and the circuit board 32 is mounted in the housing 44 (FIG. 5), the second end portion 28 operatively engages the housing 44 and prevents the male connector or terminal 52 from tilting or backing out of the female connector or terminal 54. Thus, when the electronic device is shipped from one location to another location, the retainer 20 retains the circuit board 32 in a mounted position inside the housing 44 of the electronic device, thereby eliminating malfunctioning of the electronic device due to a partially or fully dismounted circuit board 32.

It may be helpful to indicate that the retainer 20 may be removed from the electronic device after installation, for example, after a service person removes the cover or panel described above. Accordingly, a notice means 56 (FIG. 2) may be included as part of the retainer 20. For example, the body 22 could be marked with a predetermined color, like red, or, size permitting, labeled as shown in FIG. 2.

The retainer 20 can be made of any substantially rigid material capable of preventing the dismounting of the circuit board 32. For example, the retainer 20 could be made of molded plastic. A typical retainer 20 may have a body 22 thickness ranging between 0.060 to 0.085 inch and a body length 24 ranging between 0.180 to 1.25 inch. The resilient fingers 30-1, 30-2, and 30-3 could have, for example, a thickness ranging between 0.060 and 0.085 inch and an overall length ranging between 0.1875 and 0.25 inch. The depth of a typical score line could be one-half of the thickness of the body 22.

While the invention has been described with reference to a specific embodiment and, for example, typical ranges of measurements of some of the parts have been described herein, these descriptions are merely illustrative and they are not to be construed as limiting the scope of the invention. Various modifications and changes may occur to those skilled in the art without departing from the spirit and scope of the invention as defined by the appended claims.

What is claimed is:

1. A retainer for retaining a circuit board in a mounted position in a housing of an electronic device; said retainer comprising:
   a body having a length and also having first and second end portions;
   a securing means for securing said first end portion to the circuit board; and
   said second end portion including an adjusting means for adjusting said length of said body to attain a working length so that when said first end portion is secured to the circuit board and the circuit board is mounted in the housing, said second end is positioned to engage the housing and retains the circuit board in the mounted position.

2. The retainer as claimed in claim 1 in which said adjusting means comprises at least one frangible portion which can be removed to enable said body to attain said working length.

3. The retainer as claimed in claim 2 in which said securing means comprises at least two resilient fingers which are generally biased towards each other and are capable of accommodating circuit boards of varying thicknesses.

4. The retainer as claimed in claim 3 in which the retainer includes a notice means for indicating that the retainer may be removed after installation of the electronic device.

5. A retainer for retaining a circuit board in a mounted position in a housing of an electronic device during shipment of the electronic device, said circuit board and housing having a working length therebetween when the circuit board is in the mounted position in the electronic device, said retainer comprising:
   a body having a length and also having first and second end portions;

at least two resilient fingers located on said first end portion; said two resilient fingers being generally biased towards each other and adaptable for accommodating circuit boards of varying thicknesses; and said second end portion having a plurality of frangible portions which can be removed, as necessary, in order to adjust said length of said body to attain the working length so that when said first end portion is secured to the circuit board and the circuit board is in the mounted position in the housing, said second end portion is positioned to engage the housing and retain the mounted circuit board in the mounted position.

6. The retainer as claimed in claim 5 in which said plurality of frangible portions are delineated by at least one score line to demarcate each frangible portion so as to enable the length of said body to be varied when one or more of said plurality of frangible portions is removed therefrom.

7. The retainer as claimed in claim 6 in which the retainer is of a predetermined color so as to indicate that the retainer may be removed after installation of the electronic device.

8. In an electronic device having a housing and a circuit board mounted in a mounted position within the housing and with a working length being defined as the distance between the mounted circuit board and the housing of the electronic device; the method for retaining a mounted circuit board in the housing during shipment of the electronic device, comprising the steps of:

(a) selecting a retainer including a body having a length and also having first and second end portions; said second end portion having at least one frangible portion;

(b) securing said first end portion to the circuit board;

(c) removing, as necessary, one or more frangible portions from said body to attain the working length; and (d) positioning said retainer between the circuit board in the mounted position and the housing to retain the circuit board in the mounted position in the housing.

9. The method as claimed in claim 8 in which said securing step includes the step of:

(b1) using at least two resilient fingers on said body which are generally biased towards each other and which are capable of accommodating circuit boards of different thicknesses to grip the circuit board.

10. The method as claimed in claim 9, in which said removing step includes the step of:

(c1) separating each frangible portion with at least one score line so as to enable the length of said body to be varied by removing one or more frangible portions therefrom.

11. The method as claimed in claim 10, in which the method further includes the step of:

(e) marking the retainer with a predetermined color so as to indicate that the retainer may be removed from the electronic device.

* * * * *